(12) United States Patent
Wada

(10) Patent No.: US 7,196,362 B2
(45) Date of Patent: Mar. 27, 2007

(54) FIELD-EFFECT TRANSISTOR, SEMICONDUCTOR DEVICE INCLUDING FIELD-EFFECT TRANSISTOR, AND METHOD FOR MANUFACTURING FIELD-EFFECT TRANSISTOR AND SEMICONDUCTOR DEVICE

(75) Inventor: Shinichi Wada, Kagoshima (JP)

(73) Assignee: Sony Corporation (JP)

( * ) Notice: Subject to any disclaimer, the term of this patent is extended or adjusted under 35 U.S.C. 154(b) by 192 days.

(21) Appl. No.: 10/853,121

(22) Filed: May 26, 2004

(65) Prior Publication Data

US 2005/0001263 A1    Jan. 6, 2005

(30) Foreign Application Priority Data

May 30, 2003    (JP)    ............................ P2003-155374

(51) Int. Cl.
*H01L 29/739*    (2006.01)
(52) U.S. Cl. ........................ 257/195; 257/192
(58) Field of Classification Search ........ 257/192–195, 257/E29.246
See application file for complete search history.

(56) References Cited

U.S. PATENT DOCUMENTS

| | | | | | |
|---|---|---|---|---|---|
| 5,341,007 | A | * | 8/1994 | Kuwata | 257/194 |
| 5,364,816 | A | * | 11/1994 | Boos et al. | 438/172 |
| 5,406,098 | A | * | 4/1995 | Hyuga et al. | 257/192 |
| 5,777,353 | A | * | 7/1998 | Hsu et al. | 257/192 |
| 5,798,540 | A | * | 8/1998 | Boos et al. | 257/194 |

FOREIGN PATENT DOCUMENTS

JP    02-148740    6/1990

\* cited by examiner

*Primary Examiner*—N. Drew Richards
(74) *Attorney, Agent, or Firm*—Rader Fishman & Grauer PLLC; Ronald P. Kananen

(57) ABSTRACT

A high-accuracy, threshold-voltage-settable, field-effect transistor and a semiconductor device including the field-effect transistor are provided. The field-effect transistor, having a channel layer through which carriers move between a source and a drain, includes a doped layer for adjusting the threshold voltage of the transistor by changing the carrier concentration in the channel layer. In particular, the doped layer is provided in a semiconductor substrate by implantation of impurities.

8 Claims, 9 Drawing Sheets

FIELD-EFFECT TRANSISTOR, SEMICONDUCTOR DEVICE INCLUDING FIELD-EFFECT TRANSISTOR, AND METHOD FOR MANUFACTURING FIELD-EFFECT TRANSISTOR AND SEMICONDUCTOR DEVICE

BACKGROUND OF THE INVENTION

1. Field of the Invention

The present invention relates to field-effect transistors and semiconductor devices including field-effect transistors. In particular, the present invention relates to a field-effect transistor whose threshold voltage is accurately settable and a semiconductor device including such a field-effect transistor.

2. Description of the Related Art

Mobile communication systems, for example, mobile phones and personal digital assistants (PDAs), send and receive high-frequency signals with microwave, monolithic integrated circuits (MMICs).

High-value-added MMICs, for example, switching integrated circuits (switching ICs) with built-in digital control circuits and switching integrated circuits with built-in logic circuits, are required.

Switching ICs include a depletion-mode field-effect transistor (DFET) and an enhancement-mode field-effect transistor (EFET) formed on the same substrate, the DFET and the EFET having different threshold voltages from each other.

Japanese Unexamined Patent Application No. 2-148740 discloses the following: To form a semiconductor device including a DFET and an EFET on the same substrate, the DFET and the EFET having different threshold voltages from each other, gate contact layers are formed on regions for forming the DFET and the EFET. Then, only the gate contact layer formed in the region for forming the EFET is etched to decrease the thickness of the gate contact layer, whereby the distance between the gate electrode of the EFET and the carrier supply layer of the EFET is shorter than that between the gate electrode of the DFET and the carrier supply layer of the DFET; consequently, the EFET and the DFET have different threshold voltages from each other.

Referring to FIG. 9, a buffer layer 112 composed of undoped gallium arsenide (GaAs), a channel layer 113 composed of undoped GaAs, and a barrier layer 114 composed of aluminum gallium arsenide (AlGaAs) are formed in that order on a GaAs semi-insulating substrate 111 by epitaxial growth to prepare a semiconductor device 119 including a DFET 120 and an EFET 121.

The barrier layer 114 includes a spacer sublayer 114a composed of AlGaAs, an electron supply sublayer 114b composed of AlGaAs doped with n-type impurities, and a gate contact sublayer 114c composed of undoped AlGaAs, formed in that order.

A masking layer composed of a resist is formed on the uppermost layer of the GaAs semi-insulating substrate 111. The barrier layer 114, the channel layer 113, and the buffer layer 112, which are formed in regions except a DFET-forming region and an EFET-forming region, are then etched, whereby the DFET and the EFET are isolated from each other. An insulating layer 115 is then formed on the GaAs semi-insulating substrate 111.

Gate apertures 115a and 115b are formed by etching the insulating layer 115 disposed in the regions for forming the DFET 120 and the EFET 121, in order to form embedded gate regions 114d and 114e.

The gate aperture 115a in the region for forming the DFET 120 is masked with an appropriate resist layer, and then the gate contact sublayer 114c is etched through the gate aperture 115b in the region for forming the EFET 121, whereby the thickness of only the gate contact sublayer 114c in the region for forming the EFET 121 decreases.

The resist layer masking the gate aperture 115a in the region for forming the DFET 120 is removed, and then the embedded gate regions 114d and the 114e are formed by diffusing impurities into the gate contact sublayers 114c through the gate apertures 115a and 115b.

Gate electrodes 118a and 118b are formed, and then source electrodes 116a and 116b and drain electrodes 117a and 117b are formed to prepare the DFET 120 and the EFET 121 simultaneously.

SUMMARY OF THE INVENTION

In the field-effect transistor described above, achieving an accurate and desired threshold voltage setting requires etching the gate contact layer with an accuracy to several nanometers. However, etching with an accuracy to several nanometers is difficult; hence, a field-effect transistor having an accurately adjusted threshold voltage cannot be manufactured reliably. Consequently, the product yield may be reduced.

According to an aspect of the present invention, a field-effect transistor includes a source, a drain, a channel layer through which carriers move between the source and the drain, and a doped layer for adjusting the threshold voltage of the transistor by changing the carrier concentration in the channel layer. Hence, a field-effect transistor whose threshold voltage can be changed to a desirable value with high accuracy can be manufactured reliably. As a result, the product yield is improved.

The field-effect transistor of the present invention may further include a semiconductor substrate, wherein the doped layer may be provided in the semiconductor substrate. Hence, a general manufacturing process can be directly employed after the doped layer is formed. Consequently, an extra cost for a new manufacturing apparatus is not required.

The doped layer may be formed by implantation of impurity ions. Hence, a desired dosage of implanted ions and a desired acceleration voltage applied to the implanted ions can be accurately controlled; thus, a threshold voltage can be changed to a desirable value with higher accuracy.

According to another aspect of the present invention, a semiconductor device includes a semiconductor substrate and a plurality of field-effect transistors having different threshold voltages, at least one of the plurality of field-effect transistors including a source, a drain, a channel layer through which carriers move between the source and the drain, and a doped layer for adjusting the threshold voltage of the transistor by changing the carrier concentration in the channel layer. Hence, a plurality of field-effect transistors having accurately adjusted threshold voltages can be reliably manufactured on the same substrate, the plurality of the field-effect transistors having different threshold voltages. In addition, the product yield can be improved.

DESCRIPTION OF THE PREFERRED EMBODIMENTS

A field-effect transistor having a channel layer through which carriers move between a source and a drain includes a doped layer for adjusting the threshold voltage by changing the carrier concentration in the channel layer.

The threshold voltage of a field-effect transistor can be changed to a desirable value with high accuracy by providing the doped layer. Since such a field-effect transistor can be reliably manufactured, the product yield is improved.

The doped layer may be formed anywhere as long as the doped layer can change (increase or decrease) the carrier concentration in the channel layer. When the doped layer is formed in a semiconductor substrate, a general manufacturing process can be directly employed after the doped layer is formed. As a result, the manufacturing cost does not increase.

The doped layer may be formed by a variety of methods. In particular, when the doped layer is formed by implantation of impurity ions, the amount and concentration of the implanted impurities can be accurately controlled; hence, the threshold voltage of the field-effect transistor can be changed with higher accuracy.

As long as the doped layer can change (increase or decrease) the concentration of electrons or holes functioning as carriers in the channel layer, either a p-type or an n-type doped layer may be used.

The structure of a semiconductor device 1 and a method for manufacturing the semiconductor device 1 according to the present invention now will be described below with reference to the drawings.

Figure 1:
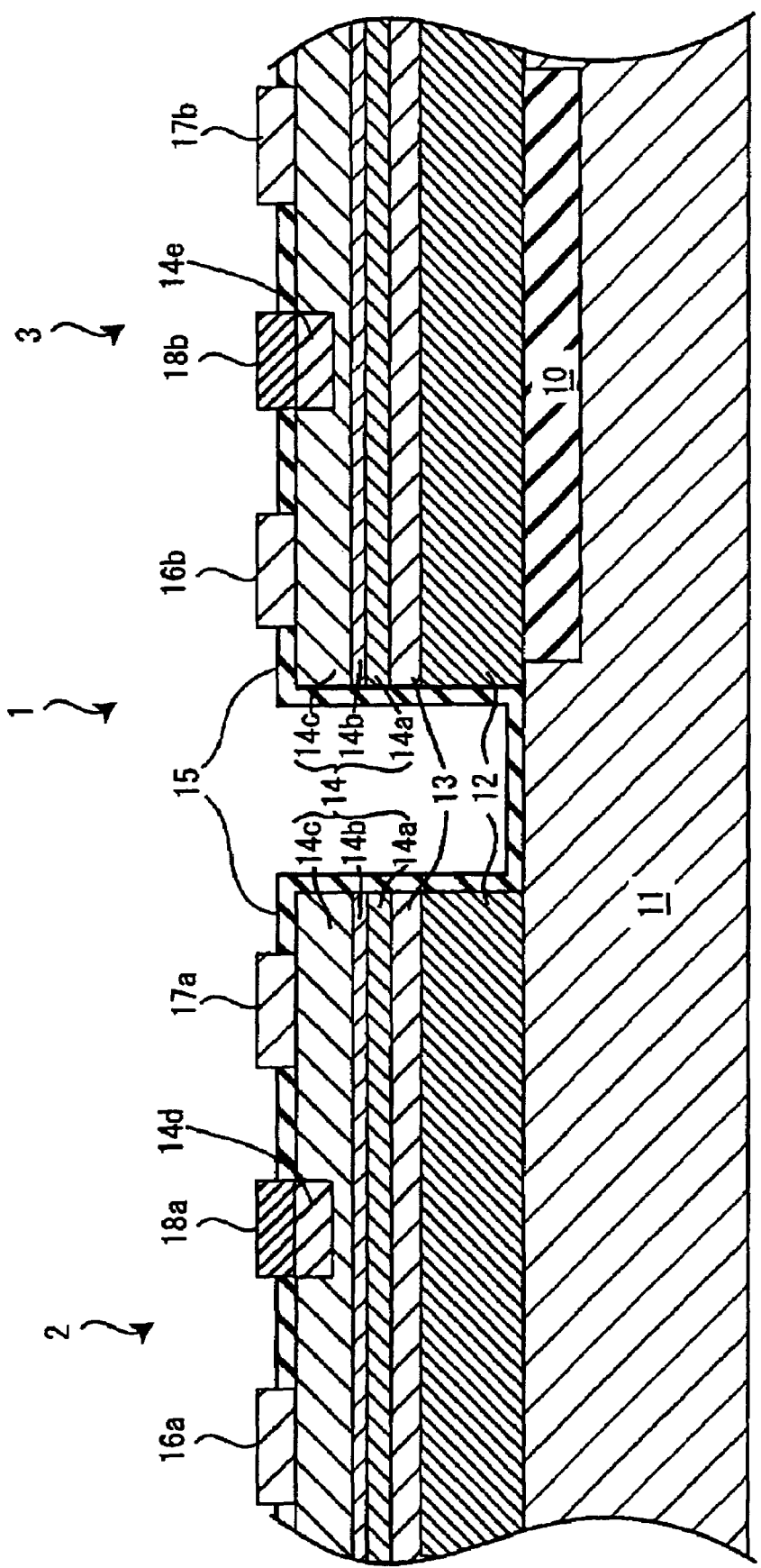
FIG. 1 is a schematic cross-sectional view of a semiconductor device according to the present invention.

As shown in FIG. 1, the semiconductor device 1 of the present invention includes a depletion-mode field-effect transistor 2 (DFET 2) and an enhancement-mode field-effect transistor (EFET 3) formed on a substrate 11, the DFET 2 and EFET 3 having different threshold voltages from each other. In particular, a doped layer 10 is provided in an EFET-forming region 8 in the substrate 11, which is a gallium arsenide (GaAs) semi-insulating substrate.

The thickness of the doped layer 10 and a p-type impurity concentration in the doped layer 10 are determined so as to achieve a predetermined threshold voltage of the EFET 3.

The doped layer 10 formed within the EFET 3 can adjust the threshold voltage by increasing or decreasing the carrier concentration in the channel layer 13 through which carriers move between a source and a drain; hence, threshold voltage setting can be achieved with higher accuracy compared with general threshold voltage setting adjusted by etching.

Furthermore, the doped layer 10 is formed in the GaAs semi-insulating substrate 11 included in the EFET-forming region 8 before a buffer layer 12 is formed. Consequently, a general manufacturing process can be directly employed after the doped layer 10 is formed.

A method for manufacturing the semiconductor device 1 according to an embodiment of the present invention now will be described in detail with reference to the FIGS. 2 through 8 below.

Figure 2:
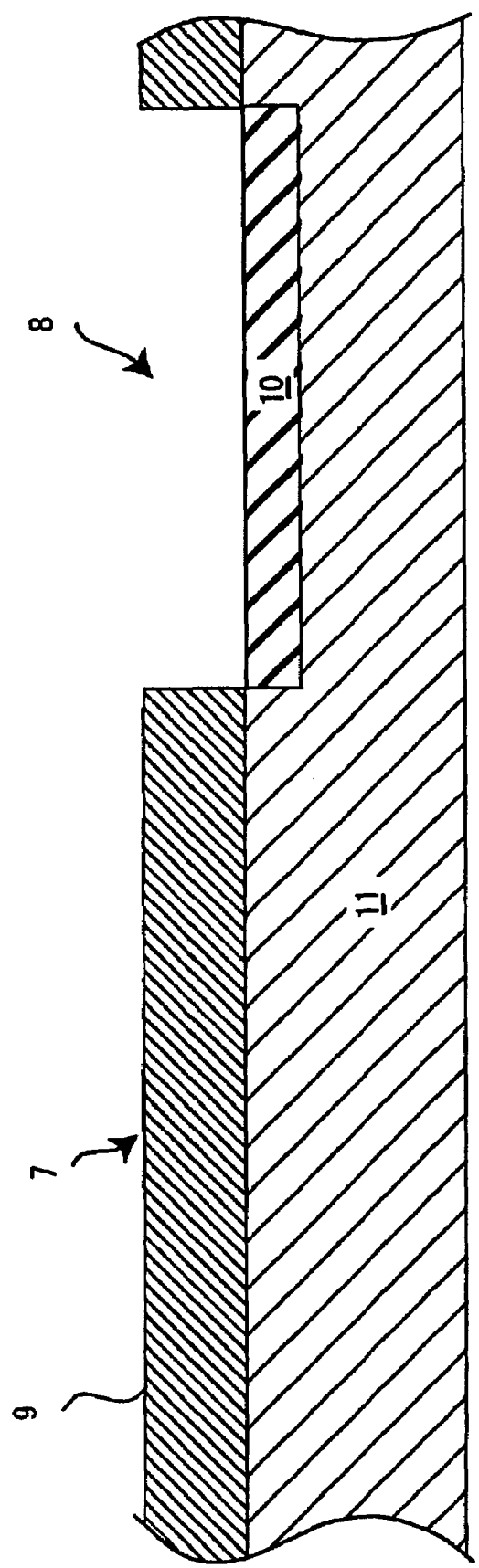
FIGS. 2 through 8 are schematic cross-sectional views illustrating the manufacturing process of a semiconductor device.

As shown in FIG. 2, a mask, which has an aperture in the EFET-forming region 8, composed of a resist 9 is formed on the GaAs semi-insulating substrate 11, and then p-type impurities are implanted by ion implantation.

Figure 3:
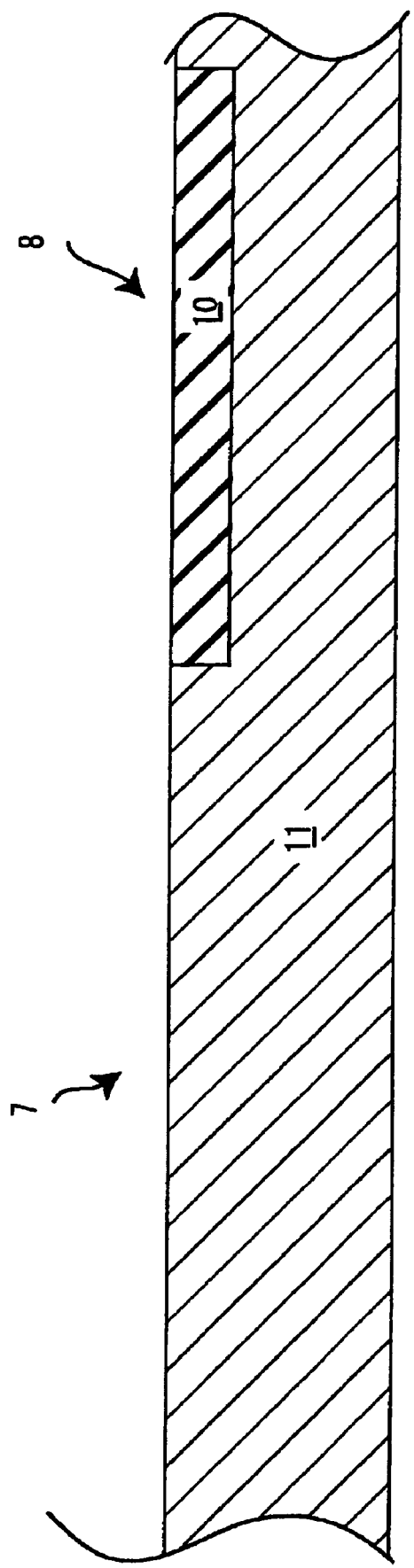

As shown in FIG. 3, the mask composed of resist 9 is removed, and then annealing is performed at an elevated temperature to form the doped layer 10. A desired thickness of the doped layer 10 and a desired p-type impurity concentration in the doped layer 10 can be achieved. In the step of forming this doped layer 10 by ion implantation, a desired dosage of implanted ions and a desired acceleration voltage applied to the implanted ions can be accurately controlled; hence, the threshold voltage can be changed to a desirable value with higher accuracy compared with general threshold voltage setting adjusted by etching.

The buffer layer 12 composed of undoped GaAs, a channel layer 13 composed of undoped GaAs, and a barrier layer 14 composed of AlGaAs are formed in that order on the GaAs semi-insulating substrate 11 by epitaxial growth.

The barrier layer 14 composed of AlGaAs includes a spacer sublayer 14a composed of undoped AlGaAs, a carrier supply sublayer 14b composed of AlGaAs doped with n-type impurities, and a gate contact sublayer 14c composed of undoped AlGaAs, formed in that order.

The epitaxial growth is performed after the doped layer 10 is formed; hence, a general manufacturing process can be directly employed for the epitaxial growth in a DFET-forming region 7 and the EFET-forming region 8.

An n-type impurity, for example, silicon (Si) is typically used as a dopant for the carrier supply sublayer 14b. A p-type impurity, for example, zinc (Zn) is typically used as a dopant for the doped layer 10 formed in the GaAs semi-insulating substrate 11.

Figure 4:
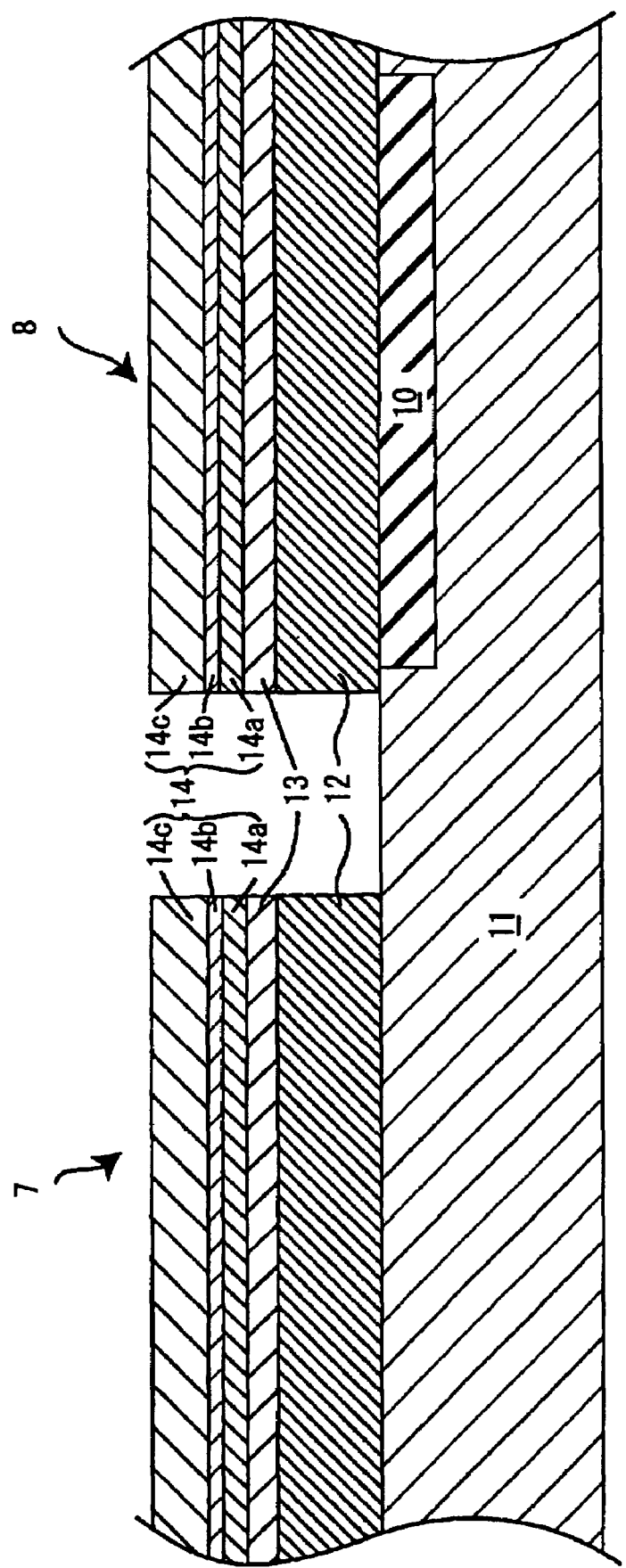
Figure 5:
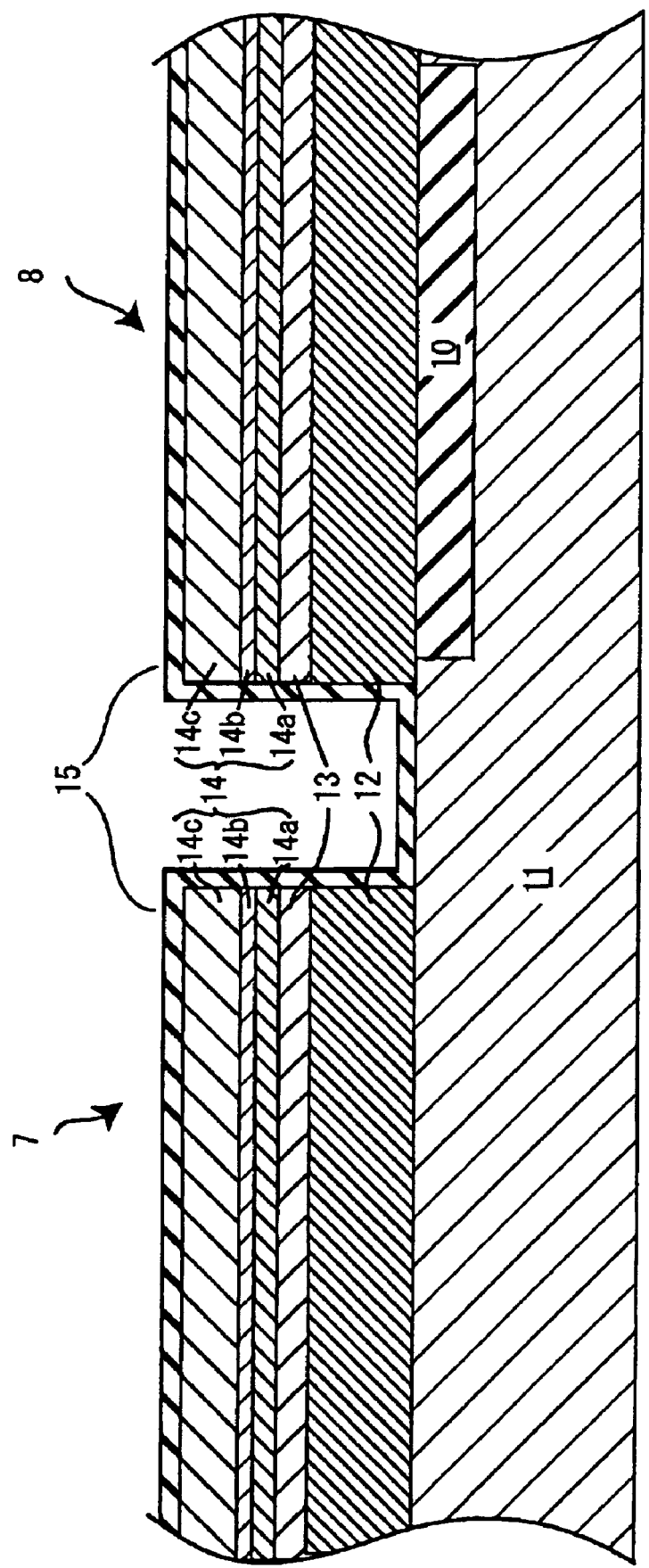

As shown in FIG. 4, the barrier layer 14, the channel layer 13, and the buffer layer 12, which are formed in a region except another element-forming region and in a region between the DFET-forming region 7 and EFET-forming region 8, are sequentially etched to isolate the DFET-forming region 7 and EFET-forming region 8. Etching is performed with, for example, an aqueous solution containing phosphoric acid and hydrogen peroxide.

An insulating layer 15 composed of silicon nitride (SiN) is formed over the GaAs semi-insulating substrate 11 by chemical vapor deposition (CVD).

Figure 6:
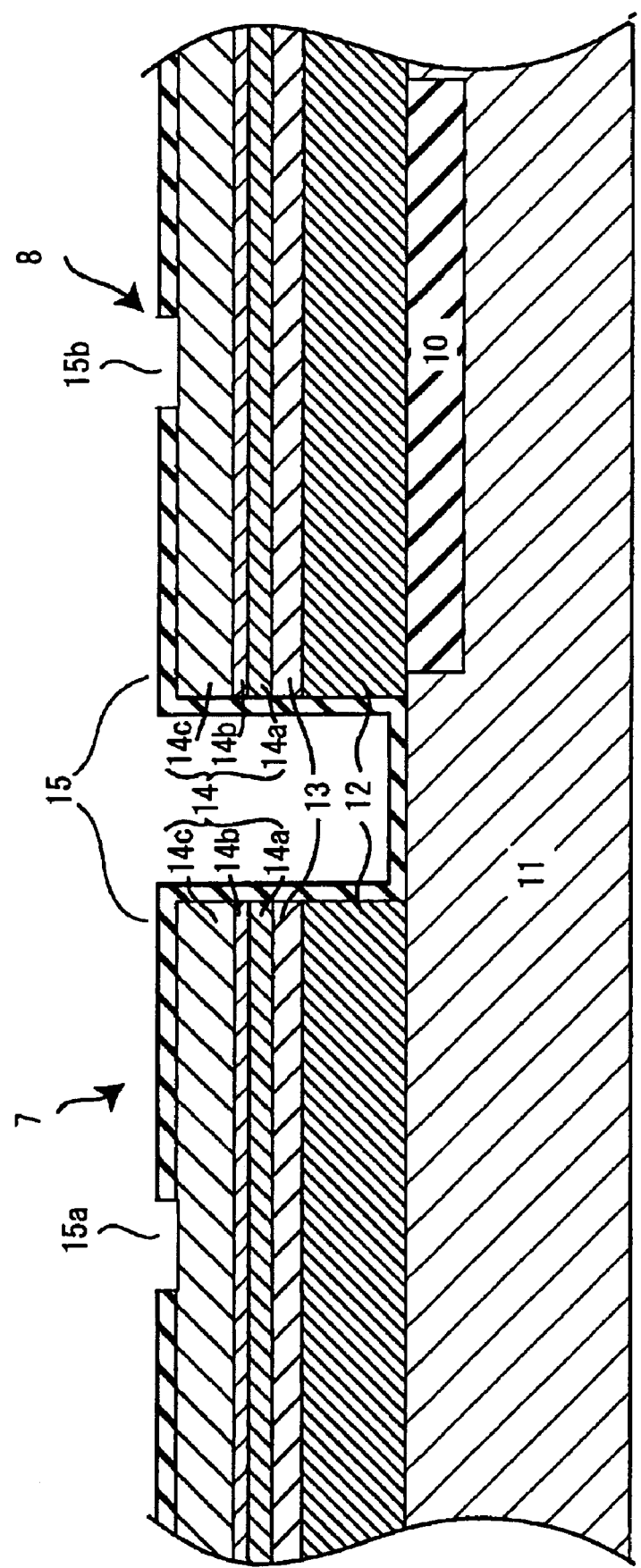

As shown in FIG. 6, an appropriate mask composed of a resist is formed on the insulating layer 15, and then the insulating layer 15 is etched by etching through the mask to form gate apertures 15a and 15b.

Figure 7:
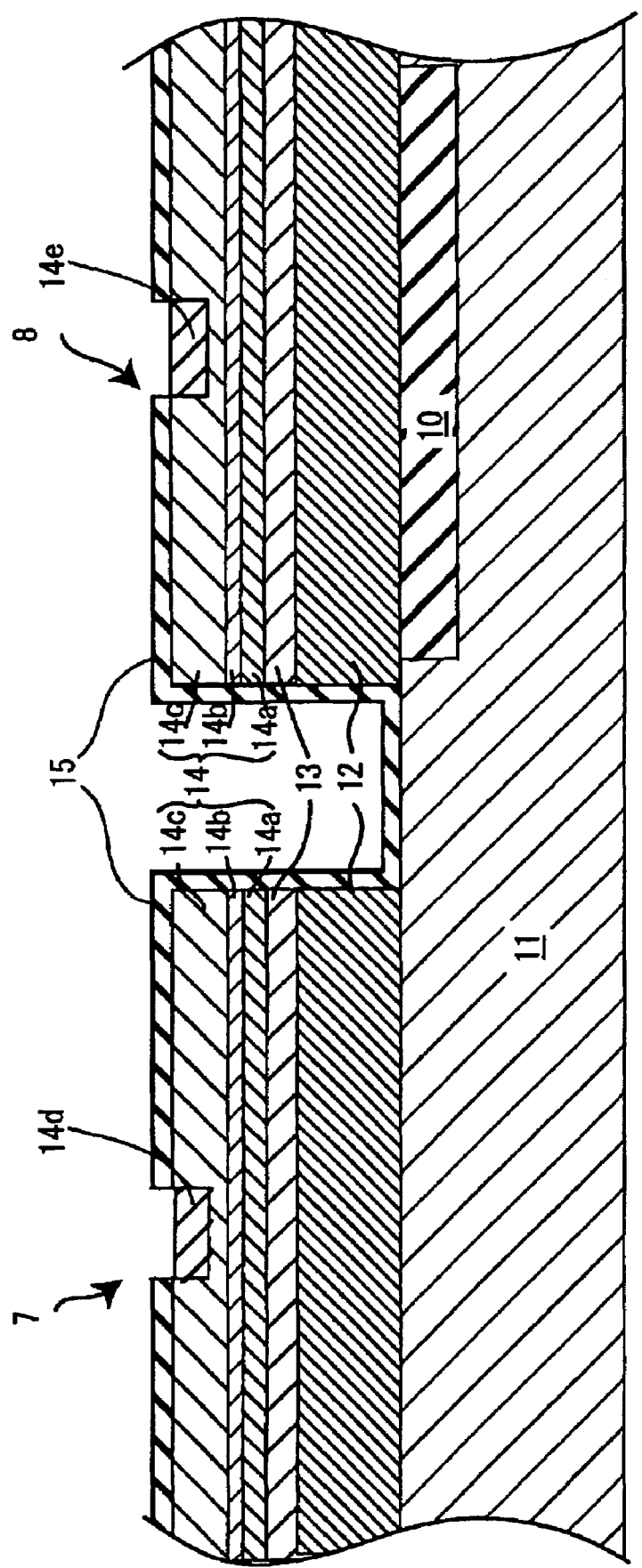

As shown in FIG. 7, zinc (Zn), which is a p-type impurity, is diffused through the insulating layer 15 functioning as a mask, having the gate apertures 15a and 15b, into the gate contact sublayer 14c by vapor-phase diffusion to form simultaneously embedded gate regions 14d and 14e in the DFET 2 and EFET 3, respectively; hence, the embedded gate regions 14d and 14e have the same depth and the same p-type impurity concentration in the embedded gate regions 14d and 14e. However, the doped layer 10 is formed previously in a predetermined region of the GaAs semi-insulating substrate 11 included in the EFET-forming region 8 by implantation of p-type impurity ions, whereby the concentration of high-concentration carriers accumulated in the channel layer 13 of the EFET 3 decreases; consequently, the eventually achieved threshold voltage of the EFET 3 shifts to a higher voltage compared with that of the DFET 2.

Figure 8:
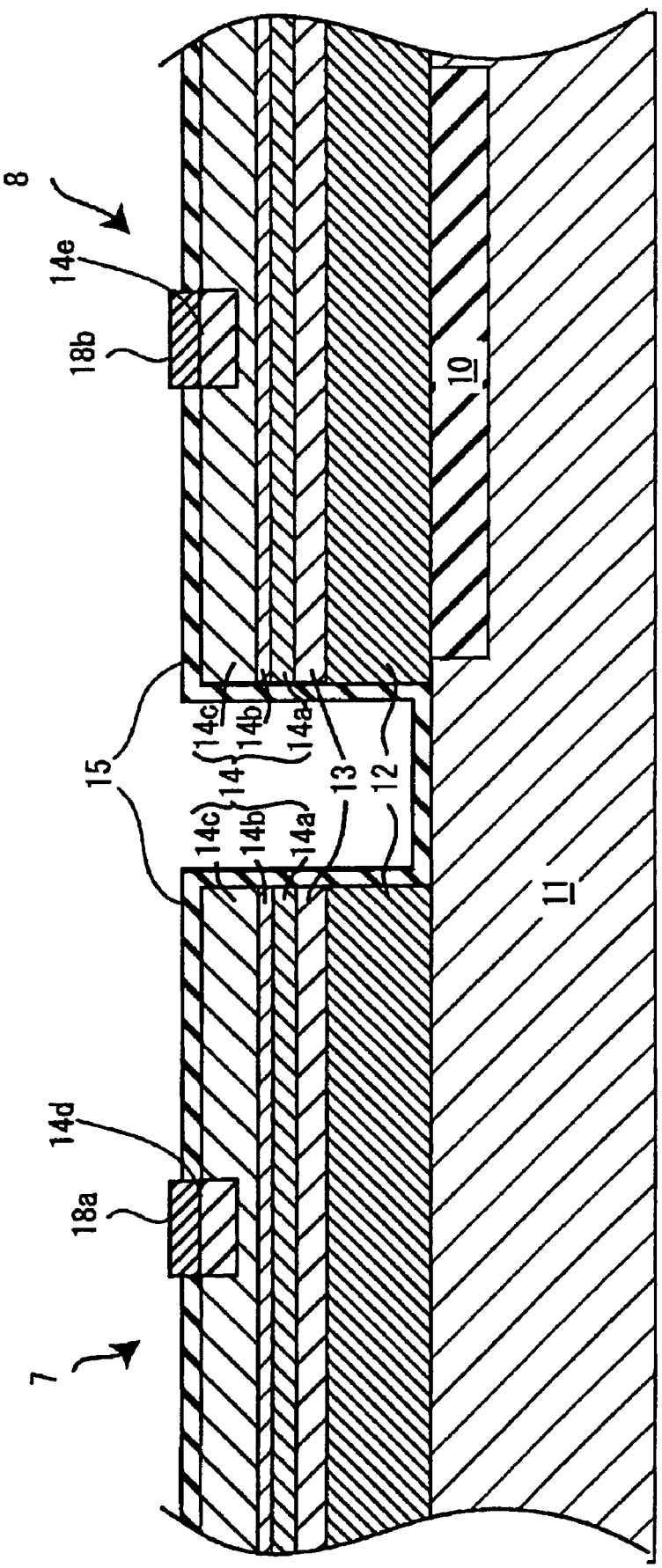
Figure 9:
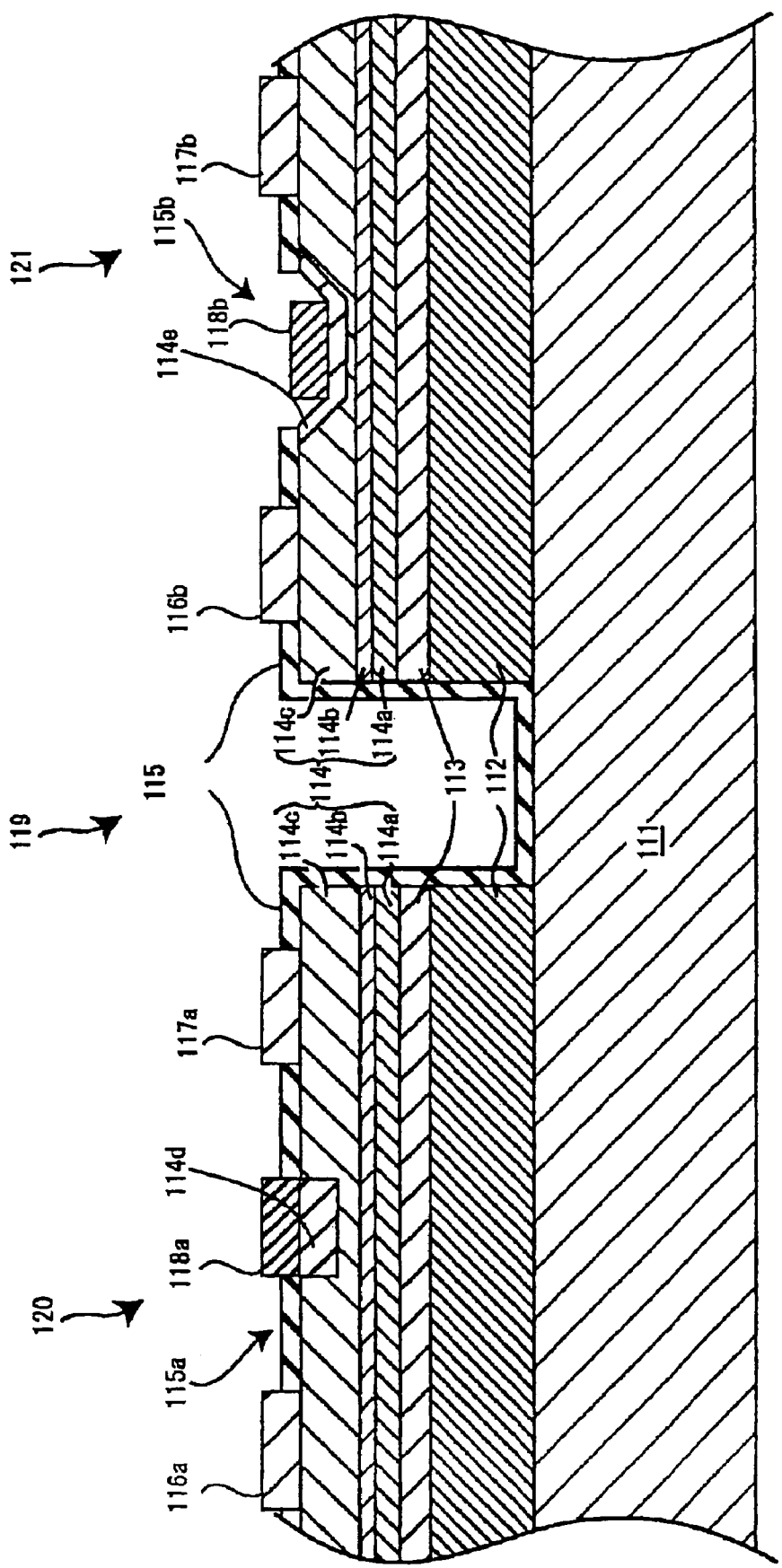
FIG. 9 is a schematic cross-sectional view of a general semiconductor device.

As shown in FIG. 8, titanium (Ti), platinum (Pt), and gold (Au) are formed in that order by vapor deposition on the embedded gate regions 14d and 14e formed above the GaAs semi-insulating substrate 11 to form gate electrodes 18a and 18b.

The regions for forming sources and drains of the DFET 2 and the EFET 3 in the insulating layer 15 are etched through a resist layer (not shown) functioning as a mask to form source apertures and drain apertures. Source electrodes 16a and 16b and drain electrodes 17a and 17b are formed in the source apertures and the drain apertures; consequently, as shown in FIG. 1, the DFET 2 and the EFET 3, with different threshold voltages from each other, are prepared on the same GaAs semi-insulating substrate 11.

According to this manufacturing method, in the EFET-forming region 8, the thickness of the doped layer 10 formed in a predetermined region within the GaAs semi-insulating substrate 11, the p-type concentration in the doped layer 10, the depth of the embedded gate region 14e formed within the gate contact sublayer 14c, and the p-type concentration in the embedded gate region 14e can be determined appropriately. As a result, the threshold voltage of the EFET 3 can be changed to a desirable value with high accuracy.

In a field-effect transistor manufactured by the above-described manufacturing process, in the step of forming the doped layer 10 by ion implantation, the dosage of the implanted ions and the acceleration voltage applied to the implanted ions can be controlled appropriately, whereby the threshold voltage can be changed to a desirable value with higher accuracy compared with a general field-effect transistor having a threshold voltage adjusted by etching; hence, a field-effect transistor whose threshold voltage can be changed to a desirable value with high accuracy can be reliably manufactured. Consequently, the product yield is improved.

In the description given above, high-electron-concentration transistors (HEMTs), which have become the most commonly used type of field-effect transistors in recent years because of their excellent high-frequency characteristic, low noise, low power consumption, and high speed operation, are described as examples of the DFET 2 and the EFET 3. However, the field-effect transistors according to the present invention are not limited to HEMTs.

What is claimed is:

1. A semiconductor device comprising:
a semiconductor substrate; and
a plurality of field-effect transistors having different threshold voltages, at least one of the plurality of field-effect transistors comprising:
a gate;
a source;
a drain;
a channel layer on the substrate to which carriers move between the source and the drain; and
a doped layer in the substrate for adjusting the threshold voltage of the transistor by changing the carrier concentration in the channel layer
wherein the channel layer and doped layer are respectively separate layers.

2. The semiconductor device according to claim 1, wherein the doped layer is formed by implantation of impurity ions.

3. A semiconductor device comprising:
a semiconductor substrate; and
a plurality of field-effect transistors having different threshold voltages in epitaxial regions, at least one of the plurality of field-effect transistors comprising:
a gate;
a source;
a drain;
a channel layer on the substrate to which carriers move between the source and the drain; and
a doped layer in the substrate for adjusting the threshold voltage of the transistor by changing the carrier concentration in the channel layer
wherein the channel layer and doped layer are respectively separate regions.

4. The semiconductor device according to claim 3, wherein the doped layer is formed by implantation of impurity ions.

5. A semiconductor device comprising:
a semiconductor substrate; and
a plurality of field-effect transistors having different threshold voltages in epitaxial regions, at least one of the plurality of field-effect transistors comprising:
a gate;
a source;
a drain;
a channel layer on the substrate to which carriers move between the source and the drain;
a buffer layer in the epitaxial region between the channel layer and the substrate;
a barrier layer in the epitaxial region between the channel layer and the gate; and
a doped layer in the substrate for adjusting the threshold voltage of the transistor by changing the carrier concentration in the channel layer
wherein the channel layer, buffer layer, barrier layer, and the doped layer are respectively separate layers.

6. The semiconductor device according to claim 5, wherein the doped layer is formed by implantation of impurity ions.

7. The semiconductor device according to claim 5, wherein the barrier layers each include a spacer sublayer, an electron supply sublayer, and a gate contact sublayer, provided in that order from the semiconductor substrate.

8. The semiconductor device according to claim 7, wherein the doped layer is formed by implantation of impurity ions.

* * * * *